(12) United States Patent
Efanov et al.

(10) Patent No.: US 10,237,054 B2
(45) Date of Patent: Mar. 19, 2019

(54) SYSTEM FOR STABILIZING DELAY

(71) Applicants: Mikhail Vladimirovich Efanov, St. Petersburg (RU); Arsenii Vadimovich Krasnov, St. Petersburg (RU)

(72) Inventors: Mikhail Vladimirovich Efanov, St. Petersburg (RU); Arsenii Vadimovich Krasnov, St. Petersburg (RU)

( * ) Notice: Subject to any disclaimer, the term of this patent is extended or adjusted under 35 U.S.C. 154(b) by 0 days.

(21) Appl. No.: 15/528,511

(22) PCT Filed: Dec. 14, 2015

(86) PCT No.: PCT/RU2015/000874
§ 371 (c)(1),
(2) Date: Jul. 18, 2017

(87) PCT Pub. No.: WO2016/108732
PCT Pub. Date: Jul. 7, 2016

(65) Prior Publication Data
US 2018/0013543 A1   Jan. 11, 2018

(30) Foreign Application Priority Data

Dec. 31, 2014   (RU) ................. 2014154542

(51) Int. Cl.
*H04L 7/033* (2006.01)
*H03H 7/30* (2006.01)
*H03K 3/53* (2006.01)
*H03K 5/135* (2006.01)

(52) U.S. Cl.
CPC ............ *H04L 7/033* (2013.01); *H03H 7/30* (2013.01); *H03K 3/53* (2013.01); *H03K 5/135* (2013.01)

(58) Field of Classification Search
CPC ...................................................... H04L 7/033
See application file for complete search history.

(56) References Cited

U.S. PATENT DOCUMENTS 7,190,201 B2 *   3/2007   Haerle ................. H03L 7/0812
327/158

* cited by examiner

*Primary Examiner* — Daniel C Puentes
(74) *Attorney, Agent, or Firm* — Inventa Capital PLC

(57) ABSTRACT

The present invention relates to pulse power technology. The system includes an input channel, a pulse edge detector (2) connected in series with two inputs, a filter (3), a variable delay unit (4), and a feedback channel from the generator to one of the inputs of the pulse edge detector (2). The system comprises a reference delay unit (1), and the input channel is connected both to the variable delay unit (4) and to a reference delay unit (1) for simultaneous supply of input to said units. Signals to both inputs of the pulse edge detector (2) are synchronous on average, i.e. tstab.avg=1/τ∫tstab dt=tref with τ>>τest.oper where: tstab.avg—generator output delay relative to the input signal, averaged over the operation time of the system τ at a given tref; tref—reference unit (1) output delay relative to the input signal; τest.oper—stabilization system time response to changes in external parameters, with the stabilization delay tstab determined from the condition tstab=tvar+tunstab where: tvar—delay of the variable delay unit (4); tunstab—unstable delay of the generator. The stabilization of the delay is independent of the pulse repetition frequency.

1 Claim, 2 Drawing Sheets

SYSTEM FOR STABILIZING DELAY

FIELD OF THE INVENTION

The present invention relates to a pulse power technology used to synchronize pulse voltage generators.

BACKGROUND OF THE INVENTION

Various semiconductors, vacuums, and other apparatus and devices are used to form voltage pulses, which have a signal propagation delay depending on the temperature and other external conditions, wherein delay stabilization systems are used for compensation of this dependency.

One known delay stabilization system includes an adjustable delay unit and a flip-flop whose input is coupled with the input device as disclosed in French Patent FR No. 2,140,713, H03K 5/135, G01S 13/78, 1973. The system includes an adjustable delay unit, a second conversion unit, whose output is connected to the output of the device and to the first flip-flop input, wherein the second input of is coupled to the input of the first conversion unit and to the input of the device. The output of above mentioned flip-flop is connected to the first input of a differentiating unit and the first input of the time counter, wherein the output is connected to the second input of the differentiating unit, whose output is connected to the control input of the adjustable delay unit.

The system stabilizes delay of input pulses in conversion units by changing an adjustable delay, which occurs under the control of output voltage from the differentiating unit. However, the accuracy of delay stabilization is not high.

This is because the time interval formed by the counter has a thermal instability due to the crystal oscillator that is included in the system. The non-synchronism of input pulses with respect to the crystal oscillator pulses is equal to the period of crystal oscillator, and becomes fully included in the error of the stabilized delay.

Another known delay stabilization system includes a serially connected conversion unit, an adjustable delay unit, a flip-flop, whose input is connected to the input of a conversion unit and the input device, as disclosed in Patent SU No. 957,422, H03K 5/153, 1982. A disadvantage of the known device is also low delay stabilization accuracy due to the presence of the crystal oscillator in the system.

Still another related prior art reference teaches a delay stabilization system including an input channel, and connected in series: a pulse edge detector with two inputs, a filter, a variable delay unit, and a feedback channel from the generator to one of the inputs of the pulse edge detector, as disclosed in U.S. Pat. No. 4,338,569, H03K 5/153, 1982. The system includes an input device for receiving an input pulse sequence and a device connected to said first input device to provide a fixed time delay in transmitting a sequence of pulses. The system also includes a pulse edge detector having first and second input channels for receiving the signal output from the device to provide a fixed delay time, which generates an output signal corresponding to the time interval between the pulse on the input channel and other input signal on the second input channel.

The system also includes a feedback device for generating a feedback signal from the output voltage of pulse edge detector device to provide input to the variable delay device to control the time delay of the output signal. The system also includes a device connecting the delayed output of the variable delay device with the second input channel of the said pulse edge detector device.

A disadvantage of this system is a dependence of the stabilized delay on the pulse repetition frequency f, because the detector inputs receive pulses delayed relative to each other by an amount equal to the sum of the variable delay time tvar and twice the time of the unstable operating system delay 2tunstab.

The system adjusts the variable delay time tvar so that the pulses on the detector input are delayed relative to each other for a time equal to the repetition period of the input pulse sequence, i.e. tvar+2tunstab=T=1/f. Consequently, changing the pulse repetition frequency f also changes the stabilization delay tstab=tvar+tunstab.

SUMMARY OF THE INVENTION

Technical result of the claimed solution is delay stabilization in the range of 1 ns-1 μs with an accuracy of 1 ps-1 ns and stabilized delay independent of the pulse repetition frequency. To achieve said technical result in the delay stabilization system, which is intended mainly for voltage impulse generators that include an input channel, the following features are connected in series: a pulse edge detector with two inputs, a filter, a variable delay unit, and a feedback channel from the generator to one of the inputs of the pulse edge detector.

According to the invention, the system further comprises a reference delay unit, and the input channel is connected both to a variable delay unit, and to the reference delay unit for simultaneous input signal to the said units, with the signals to both inputs of the pulse edge detector being synchronous on average, i.e. tstab.avg=$1/\tau \int$ tstab dt=tref with $\tau \gg \tau$est.oper where: tstab.avg—generator output delay relative to the input signal, averaged over the operation time of the system $\tau$ at a given tref; tref—reference unit output delay relative to the input signal; τest.oper—stabilization system response time to changes in external parameters, with the stabilization delay tstab determined from the condition tstab=tvar+tunstab where: tvar—delay time of the variable delay unit; tunstab—unstable delay of the generator.

BRIEF DESCRIPTION OF THE DRAWINGS

Other advantages of the present invention will be readily appreciated as the same becomes better understood by reference to the following detailed description when considered in connection with the accompanying drawings wherein.

DETAILED DESCRIPTION OF THE INVENTION

The proposed delay stabilization system can be used to stabilize the delay and synchronize buffer logic devices, amplifiers and impulse voltage generators. An example of a particular implementation is given for the delay stabilization of a generator with unstable delay.

Figure 1:
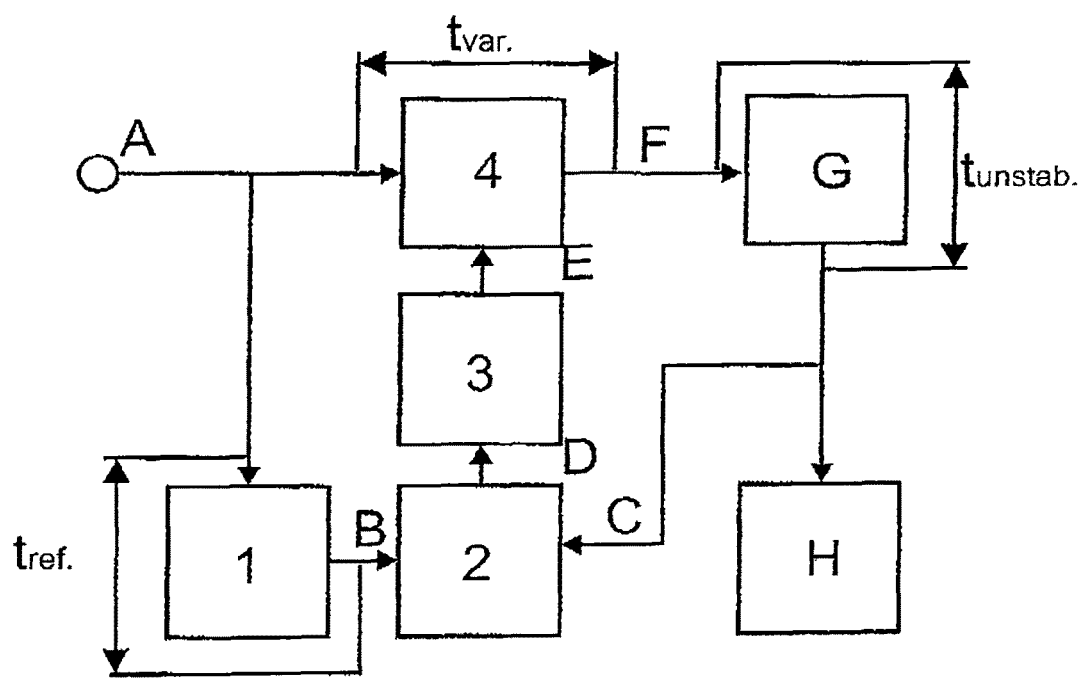
FIG. 1 is a functional block diagram.

A delay stabilization system of the present invention includes the following elements connected in series: a reference delay unit 1, a pulse edge detector 2, a filter 3 and a variable delay unit 4 as shown in FIG. 1. The delay stabilization system includes an input channel A triggering a system for receiving a sequence of triggering voltage pulses U1, shown as a plot "a" in FIG. 2. Input A is connected both to the reference delay unit 1 and to the variable delay unit 4 for simultaneous input to the said units.

The reference delay unit 1 is intended to provide a delay time tref of the first input pulse sequence (input signal). The delay tref from reference delay unit 1 may be fixed or adjustable. Adjustment is carried out by an external signal or via control interface, such as a potentiometer, in the reference delay unit 1. As the pulse edge detector 2, a flip-flop is used in the system, having two inputs B and C, as well as an output channel D.

Input B is used to receive a signal coming from the reference delay unit 1 with the delay time tref relative to the input signal. Input C is used for receiving a signal with a delay time tstab relative to the input signal from the feedback channel from the voltage pulse generator, shown at D in FIG. 1.

The pulse edge detector 2 is used to generate a high or low voltage output signal that is feed to the filter 3. The filter 3 is an integrator whose output signal voltage increases or decreases depending on the signal received from the pulse edge detector 2, whereby the voltage at the output of the filter 3 corresponds to the mean value of the voltage supplied from the pulse edge detector 2.

The variable delay unit 4 has an input for receiving the input signal and an input D for receiving the signal from the filter 3. The variable delay unit 4 includes a delay element, a control delay depending on the voltage from the filter 3. The variable delay unit 4 is connected to the generator with unstable delay tunstab.

The system works as follows. The input channel A signal is fed with pulse voltage generator start signal. The input of the reference delay unit 1 receives a signal U1 in the form of pulses with a repetition frequency f and period T=1/f, shown as plot "a" in FIG. 2.

Figure 2:
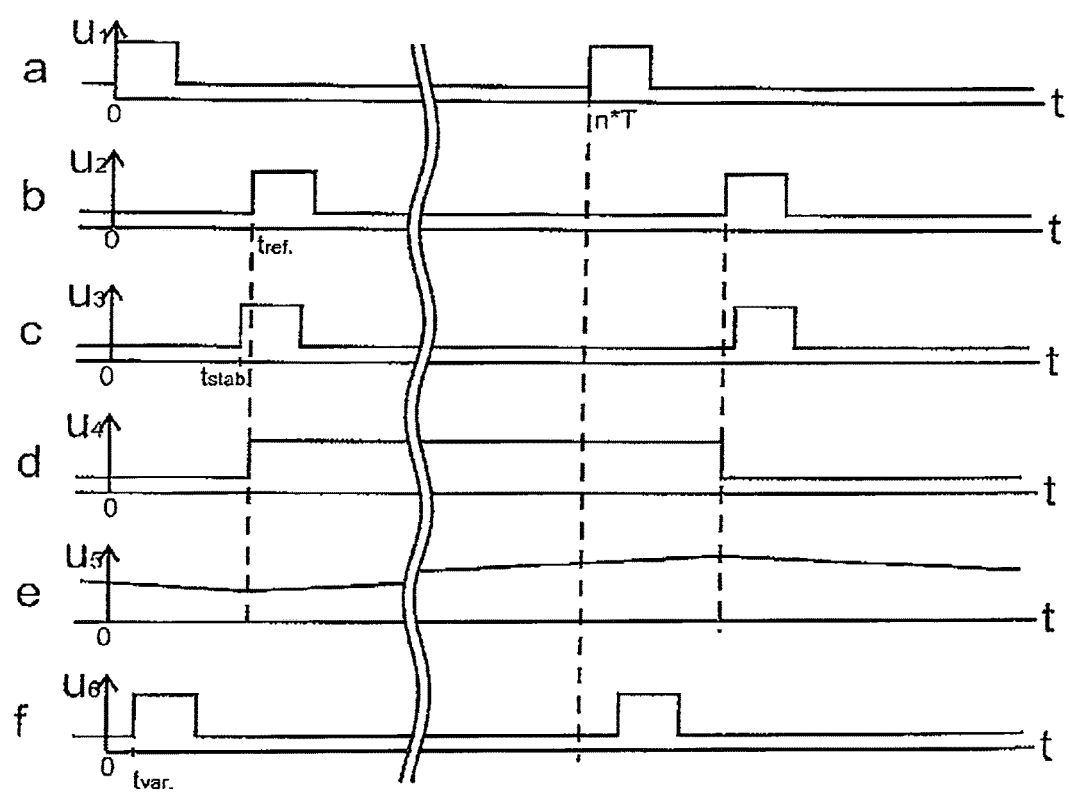
FIG. 2 shows timing charts of the voltage change.

The reference delay unit 1 introduces, for example, a fixed stable delay tref to the signal U1, and the input B of the pulse edge detector 2 receives the signal U2, which is delayed relative to signal U1 by a delay time tref, shown as plot "b" in FIG. 2.

The input C of the pulse edge detector 2 receives signal U3 with a stabilization delay tstab, which is the sum of unstable delay tunstab of the generator and variable delay tvar of the variable delay unit 4, i.e. tstab=tvar+tunstab relative to the start signal U1, shown as plot "a" in FIG. 2.

At its output point, the pulse edge detector 2 generates a logical signal U4, shown as plot "d" in FIG. 2, depending on which input B or C previously received rising pulse edge, if tref>tunstab+tvar, then 1–a high voltage or 0–a low voltage.

The logic signal U4 from the pulse edge detector 2 is supplied to the filter 3, which generates a control voltage Uctrl (U5) for the variable delay unit 4, shown as plot "e" in FIG. 2.

The variable delay unit 4 delays the signal U1 by a time close to the value of tvar=tref−tunstab=t (Uctrl), shown as plot "f" in FIG. 2. Thus, the signal delay from the input channel to the output of the generator is close to the value tvar+tunstab=tref.

Here is an example of particular parameters. Let pulse voltage generator delay tunstab vary in the range of 40-60 ns, the time change Tunstab of unstable delay much higher than reaction time of the system, the reference delay tref is set to 60 ns. Then at τest.oper<<<<τunstab, the average stabilization delay is:

$$t_{стаб.ср} = 1/\tau \int_0^\tau t_{стаб}\, dt = 1/\tau \int_0^\tau (t_{изм} + t_{нестаб})\, dt = 1/\tau \int_0^\tau t_{изм}\, dt + t_{нестаб} = t_{изм.ср} + t_{нестаб} = t_{опорн}$$

The stabilization system adjusts the variable delay so that: at tunstab=40 ns, tvar.avg=tref−tunstab=60 ns−40 ns=20 ns, at tunstab=50 ns, tvar.avg=tref−tunstab=60 ns−50 ns=10 ns, at tunstab=60 ns, tvar.avg=tref−tunstab=60 ns−60 ns=0 ns. In all cases, the average delay from the start signal to the output of the generator is equal to tstab.avg=tvar.avg+tunstab=tref=60 ns.

INDUSTRIAL APPLICABILITY

The proposed delay stabilization system adds a variable delay to stabilize an unstable generator delay and thus compensates for changes in the delay of the generator. The delay stabilization system stabilizes the delay between the input A of the system and the generator output, while the pulses on the inputs B and C of the pulse edge detector arrive synchronously, eliminating the dependence of stabilized delay on the pulse repetition frequency. The proposed system stabilizes the delay of the pulse sequence of the duration from a few nanoseconds and more, with precision of a few picoseconds regardless of the pulse repetition frequency.

What is claimed is:

1. A pulse voltage generator delay stabilization system, comprising:
    an input channel providing an input signal,
    a pulse edge detector connected in series with two inputs,
    a filter,
    a variable delay unit,
    a feedback channel extending from a generator to one of said inputs of said pulse edge detector, whereby said pulse voltage generator delay stabilization system further includes a reference delay unit, with said input channel is connected both said variable delay unit and to said reference delay unit for simultaneous supply of the input signal to said units, and signals to both inputs of said pulse edge detector are synchronous on average, such as tstab.avg=0.1/τ∫tstab dt=tref with τ>>τest.oper, where:
    tstab.avg is generator output delay relative to the input signal, averaged over the operation time of said pulse voltage generator delay stabilization system τ at a given tref;
    tref is reference unit output delay relative to the input signal;
    τest.oper is stabilization system time response to changes in external parameters, with stabilization delay tstab determined from the condition tstab=tvar+tunstab, where: war is delay of said variable delay unit;
    tunstab is unstable delay of said pulse voltage generator.

* * * * *